United States Patent
Chang et al.

(10) Patent No.: US 8,203,896 B2
(45) Date of Patent: *Jun. 19, 2012

(54) MEMORY CHIP AND METHOD FOR OPERATING THE SAME

(75) Inventors: Kuen-Long Chang, Taipei (TW); Chun-Hsiung Hung, Hsinchu (TW); Chuan-Ying Yu, Zhubei (TW); Chun-Yi Lee, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/911,173

(22) Filed: Oct. 25, 2010

(65) Prior Publication Data

US 2011/0038218 A1 Feb. 17, 2011

Related U.S. Application Data

(62) Division of application No. 12/256,042, filed on Oct. 22, 2008, now Pat. No. 7,885,129.

(60) Provisional application No. 61/056,463, filed on May 28, 2008.

(51) Int. Cl.
*G11C 7/00* (2006.01)
*G11C 11/50* (2006.01)
*G11C 7/04* (2006.01)

(52) U.S. Cl. ........ 365/201; 365/190; 365/191; 365/164; 365/211; 365/212

(58) Field of Classification Search .................. 365/164, 365/190, 191, 201, 211, 212
See application file for complete search history.

(56) References Cited

U.S. PATENT DOCUMENTS

| | | | |
|---|---|---|---|
| 5,757,705 A | 5/1998 | Manning | |
| 2002/0144397 A1* | 10/2002 | Morris | 29/848 |
| 2003/0177634 A1 | 9/2003 | Morris | |
| 2005/0121766 A1* | 6/2005 | Devnani et al. | 257/691 |

* cited by examiner

*Primary Examiner* — Ly D Pham
(74) *Attorney, Agent, or Firm* — Thomas|Kayden

(57) ABSTRACT

A memory chip and method for operating the same are provided. The memory chip includes a number of pads. The method includes inputting a number of first test signals to the pads respectively, wherein the first test signals corresponding to two physically-adjacent pads are complementary; inputting a number of second test signals, respectively successive to the first test signals, to the pads, wherein the first test signal and the second test signal corresponding to each of the pads are complementary; and outputting expected data from the memory chip if the first test signals and the second test signals are successfully received by the memory chip.

11 Claims, 8 Drawing Sheets

48 TSOP

| | | | |
|---|---|---|---|
| A15 | 1 | 48 | A16 |
| A14 | 2 | 47 | BYTE# |
| A13 | 3 | 46 | GND |
| A12 | 4 | 45 | Q15/A-1 |
| A11 | 5 | 44 | Q7 |
| A10 | 6 | 43 | Q14 |
| A9 | 7 | 42 | Q6 |
| A8 | 8 | 41 | Q13 |
| A19 | 9 | 40 | Q5 |
| A20 | 10 | 39 | Q12 |
| WE# | 11 | 38 | Q4 |
| RESET# | 12 | 37 | Vcc |
| A21 | 13 | 36 | Q11 |
| WP#/ACC | 14 | 35 | Q3 |
| RY/BY# | 15 | 34 | Q10 |
| A18 | 16 | 33 | Q2 |
| A17 | 17 | 32 | Q9 |
| A7 | 18 | 31 | Q1 |
| A6 | 19 | 30 | Q8 |
| A5 | 20 | 29 | Q0 |
| A4 | 21 | 28 | OE# |
| A3 | 22 | 27 | GND |
| A2 | 23 | 26 | CE# |
| A1 | 24 | 25 | A0 |

FIG. 1B

MEMORY CHIP AND METHOD FOR OPERATING THE SAME

CROSS REFERENCE TO RELATED APPLICATIONS

This application is a divisional application of U.S. application Ser. No. 12/256,042, filed Oct. 22, 2008, now U.S. Pat. No. 7,885,129, which claimed the benefit of U.S. Provisional Application No. 61/056,463, filed May 28, 2008.

BACKGROUND OF THE INVENTION

1. Field of the Invention

The invention relates in general to a memory chip and method for operating the same, and more particularly to a memory chip applied in a multi-chip package (MCP) and method for operating the same.

2. Description of the Related Art

Along with the multi-chip packaging technology develops, an integrated circuit (IC) provider, especially for mobile-phone applications, tends to incorporate several chips, including a known-good-die (KGD) Flash memory, a SRAM memory and a controller etc. provided by different suppliers, into a multi-chip package (MCP) so as to reduce the cost of IC products.

Normally, when a memory chip including several bare dies is supplied to the IC provider, the die supplier will test all the bare dies to guarantee their good quality and reliability, such as at least 90% dies are good. Accordingly, the IC provider can package the known good-dies together with other IC chips. However, one trouble often confuses the die supplier: during the package process, if any damage happens to cause a failure to the whole package device, there is no way for the IC provider to know which component is damaged in the MCP and whether the failure reason is assembly induced or component itself induced.

Conventionally, a method called Boundary Scan is used to test the MCP. However, it requires a core chip's support to provide an input signal and needs the memory chip to have the same protocol, otherwise, it is difficult to execute the test process by the core chip. Therefore, the conventional Boundary-Scan method complicates the whole test process.

SUMMARY OF THE INVENTION

The invention is directed to a memory chip and method for operating the same. By successively inputting two sets of complementary test signals to the pads of the memory chip or outputting two clocks of complementary test signals by the pads, open/short states of the pads can be easily tested by determining whether the two complementary test signals are received through the pads or whether the two complementary test signals are read from the pads. Therefore, the test process of the memory chip can be simplified.

According to a first aspect of the present invention, a method for operating a memory chip is provided. The memory chip includes a number of pads. The method includes inputting a number of first test signals to the pads respectively, wherein the first test signals corresponding to two physically-adjacent pads are complementary; inputting a number of second test signals, respectively successive to the first test signals, to the pads, wherein the first test signal and the second test signal corresponding to each of the pads are complementary; and outputting expected data from the memory chip if the first test signals and the second test signals are successfully received by the memory chip.

According to a second aspect of the present invention, a method for operating a memory chip is provided. The memory chip includes a number of pads. The method includes receiving a test command; outputting a number of first test signals through the pads in response to the test command, wherein the first test signals corresponding to two physically-adjacent pads are complementary; and outputting a number of second test signals successive to the first test signals through the pads in response to the test command, wherein the first test signal and the second test signal corresponding to each of the pads are complementary.

According to a third aspect of the present invention, a memory chip is provided. The memory chip includes a number of pads, a command decode unit, and an expected-data generator. The pads are for inputting a number of first test signals and a number of second test signals, respectively successive to the first test signals, wherein the first test signals corresponding to two physically-adjacent pads are complementary, and the first test signal and the second test signal corresponding to each of the pads are complementary. The command decode unit is coupled to the pads for receiving the first test signals and the second test signals. The expected-data generator is coupled to the command decode unit, wherein the command decode unit controls the expected-data generator to generate expected data for output if the command decode unit successfully receives the first test signals and the second test signals.

According to a fourth aspect of the present invention, a memory chip having a plurality of pads is provided. The memory chip includes a command decode unit and an expected-data generator. The command decode unit is for receiving a test command. The expected-data generator is for respectively outputting a number of first test signals and a number of second test signals successive to the first test signals through the pads in response to the test command, wherein the first test signals corresponding to two physically-adjacent pads are complementary, and the first test signal and the second test signal corresponding to each of the pads are complementary.

The invention will become apparent from the following detailed description of the preferred but non-limiting embodiments. The following description is made with reference to the accompanying drawings.

BRIEF DESCRIPTION OF THE DRAWINGS

FIG. 1B is a schematic diagram of pad order arrangement of a parallel flash memory 48STOP.

DETAILED DESCRIPTION OF THE INVENTION

The invention is directed to a memory chip and method for operating the same. The memory chip has a number of pads.

Two sets of complementary test signals are inputted to the pads or two clocks of complementary test signals are outputted by the pads, wherein the test signals corresponding to two physically-adjacent pads are complementary. In this way, open/short states of the pads can be easily tested by just determining whether the two inputted complementary test signals are received through the pads or whether the two outputted complementary test signals are read from the pads.

Embodiment One

Figure 1A:
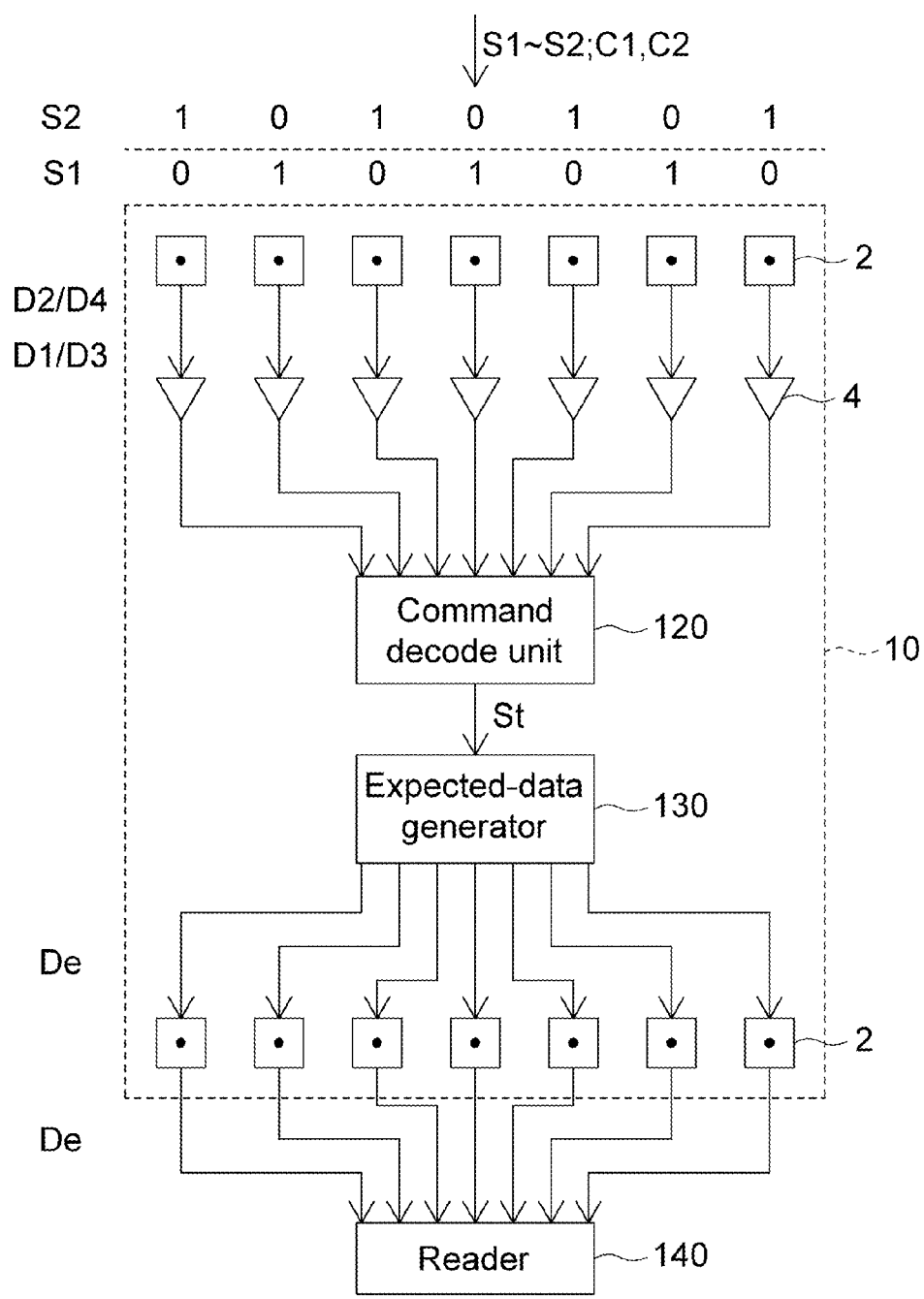
FIG. 1A is a block diagram of a system for testing a chip package according to a first embodiment of the invention.

Referring to FIG. 1A, a block diagram of a memory chip according to a first embodiment of the invention is shown. The memory chip 10, such as a KGD memory applied in a MCP, includes a number of pads 2. In the embodiment, the pads 2 include address pads and I/O pads. The memory chip 10 further includes a command decode unit 120 and an expected-data generator 130. The pads of the memory chip 10 are respectively inputted by a number of first test signals S1 and successively, the pads 2 are respectively inputted by a number of second test signals S2.

As shown in FIG. 1A, the first test signals S1 corresponding to two physically-adjacent pads 2 are complementary (0 and 1). The first test signal S1 and the second test signal S2 corresponding to each of the pads are complementary. Although, the test signals S1 and S2 are exemplified to be inputted to the address and I/O pads in the embodiment, the test signals S1 and S2 in the invention can be also inputted to the address pads 2 only in order to test the address pads 2.

For example, the memory chip 10 is a parallel flash memory 48TSOP, which includes 22 address pads A0~A21 and 16 I/O pads Q0~Q15, as shown in FIG. 1B. The 22 address pads are respectively A0, A1, A2, . . . , A20 and A21 in a logic sequence, and A1, A2, A3, A4, A5, A6, A7, A17, A18, A21, A20, A19, A8, A9, A10, A11, A12, A13, A14, A15 (from the left bottom to the left top) and A0, A16 (respectively at the right bottom and the right top) in a physical pattern. The 16 I/O pads are respectively Q0, Q1, Q2, . . . , Q14 and Q15 in a logic sequence, and Q0, Q8, Q1, Q9, Q2, Q10, Q3, Q11, Q4, Q12, Q5, Q13, Q6, Q14, Q7 and Q15 (from the right bottom to the right top) in a physical pattern.

The first and second test signals S1 and S2 respectively corresponding to the address pads A0~A21 and I/O pads Q0~Q15 in a physical pattern are shown as below:

| Left side: | | | | | | | | | |
|---|---|---|---|---|---|---|---|---|---|
| A1 | A2 | A3 | A4 | A5 | A6 | A7 | A17 | A18 | A21 |
| S1: 1 | 0 | 1 | 0 | 1 | 0 | 1 | 0 | 1 | 0 |
| S2: 0 | 1 | 0 | 1 | 0 | 1 | 0 | 1 | 0 | 1 |
| A20 | A19 | A8 | A9 | A10 | A11 | A12 | A13 | A14 | A15 |
| S1: 1 | 0 | 1 | 0 | 1 | 0 | 1 | 0 | 1 | 0 |
| S2: 0 | 1 | 0 | 1 | 0 | 1 | 0 | 1 | 0 | 1 |

| Right side: | | | | | | | | |
|---|---|---|---|---|---|---|---|---|
| A0 | Q0 | Q8 | Q1 | Q9 | Q2 | Q10 | Q3 | Q11 |
| S1: 0 | 1 | 0 | 1 | 0 | 1 | 0 | 1 | 0 |
| S2: 1 | 0 | 1 | 0 | 1 | 0 | 1 | 0 | 1 |
| Q4 | Q12 | Q5 | Q13 | Q6 | Q14 | Q7 | Q15 | A16 |
| S1: 1 | 0 | 1 | 0 | 1 | 0 | 1 | 0 | 1 |
| S2: 0 | 1 | 0 | 1 | 0 | 1 | 0 | 1 | 0 |

As represented in a logic sequence, the first signals S1 is corresponding to a first test binary code (address) TB1 "1555CCh" in the logic sequence of the address pads A[0: 21] and a third test binary code (data) TB3 "00FFh" in the logic sequence of the I/O pads Q[0: 15]. The second signals S2 is corresponding to a second test binary code (address) TB2 "2CCC55h" in the logic sequence of the address pads A[0: 21] and a fourth test binary code (data) TB4 "FF00h" in the logic sequence of the I/O pads Q[0: 15], as shown below.

| | A0 | A1 | A2 | A3 | A4 | A5 | A6 | A7 | A8 | A9 | A10 | A11 |
|---|---|---|---|---|---|---|---|---|---|---|---|---|
| TB1: | 0 | 1 | 0 | 1 | 0 | 1 | 0 | 1 | 1 | 0 | 1 | 0 |
| TB2: | 1 | 0 | 1 | 0 | 1 | 0 | 1 | 0 | 0 | 1 | 0 | 1 |

| | A12 | A13 | A14 | A15 | A16 | A17 | A18 | A19 | A20 | A21 |
|---|---|---|---|---|---|---|---|---|---|---|
| TB1: | 1 | 0 | 1 | 0 | 1 | 0 | 1 | 0 | 1 | 0 |
| TB2: | 0 | 1 | 0 | 1 | 0 | 1 | 0 | 1 | 0 | 1 |

TB1 = 0101010110101010101010,
TB2 = 1010101001010101010101

| | Q0 | Q1 | Q2 | Q3 | Q4 | Q5 | Q6 | Q7 | Q8 |
|---|---|---|---|---|---|---|---|---|---|
| TB3: | 1 | 1 | 1 | 1 | 1 | 1 | 1 | 1 | 0 |
| TB4: | 0 | 0 | 0 | 0 | 0 | 0 | 0 | 0 | 1 |

| | Q9 | Q10 | Q11 | Q12 | Q13 | Q14 | Q15 |
|---|---|---|---|---|---|---|---|
| TB3: | 0 | 0 | 0 | 0 | 0 | 0 | 0 |
| TB4: | 1 | 1 | 1 | 1 | 1 | 1 | 1 |

TB3 = 1111111100000000,
TB4 = 0000000011111111

The command decode unit 120 is for receiving the test signals S1 and S2 in order to determine whether the test signals S1 and S2 are successfully received by the memory chip 10 through the address pads and I/O pads. The data successively received through the address pads and the I/O pads corresponding to the test signals S1 and S2 are first stored in input buffers 4 of the memory chip 10 and then passed to the command decode unit 120.

The memory chip 100 respectively reconstructs the data D1 and D2 received through the address pads corresponding to the test signals S1 and S2 into a first binary code BC1 and a second binary code BC2 according to the logic sequence of the address pads, and reconstructs the data D3 and D4 received through the I/O pads corresponding to the test signals S3 and S4 into a third binary code BC3 and a fourth binary code BC4 according to the logic sequence of the I/O pads.

Then, the command decode unit 120 determines whether the first binary code BC1 and the second binary code BC2 are respectively the same as the first test binary code TB1 and the second test binary code TB2, and determines whether the third binary code BC3 and the fourth binary code BC4 are respectively the same as the third test binary code TB3 and the fourth test binary code TB4. In a normal condition without pad-to-pad short or pad-open/short states on the memory chip 10, the data D1~D4 received through the address pads and the I/O pads will be respectively the same as the test signals S1~S4 inputted to the address pads and the I/O pads. That is, the binary codes BC1~BC4 obtained after decoding will be respectively the same as the test binary codes TB1~TB4 corresponding to the test signals S1~S4.

Figure 1C:
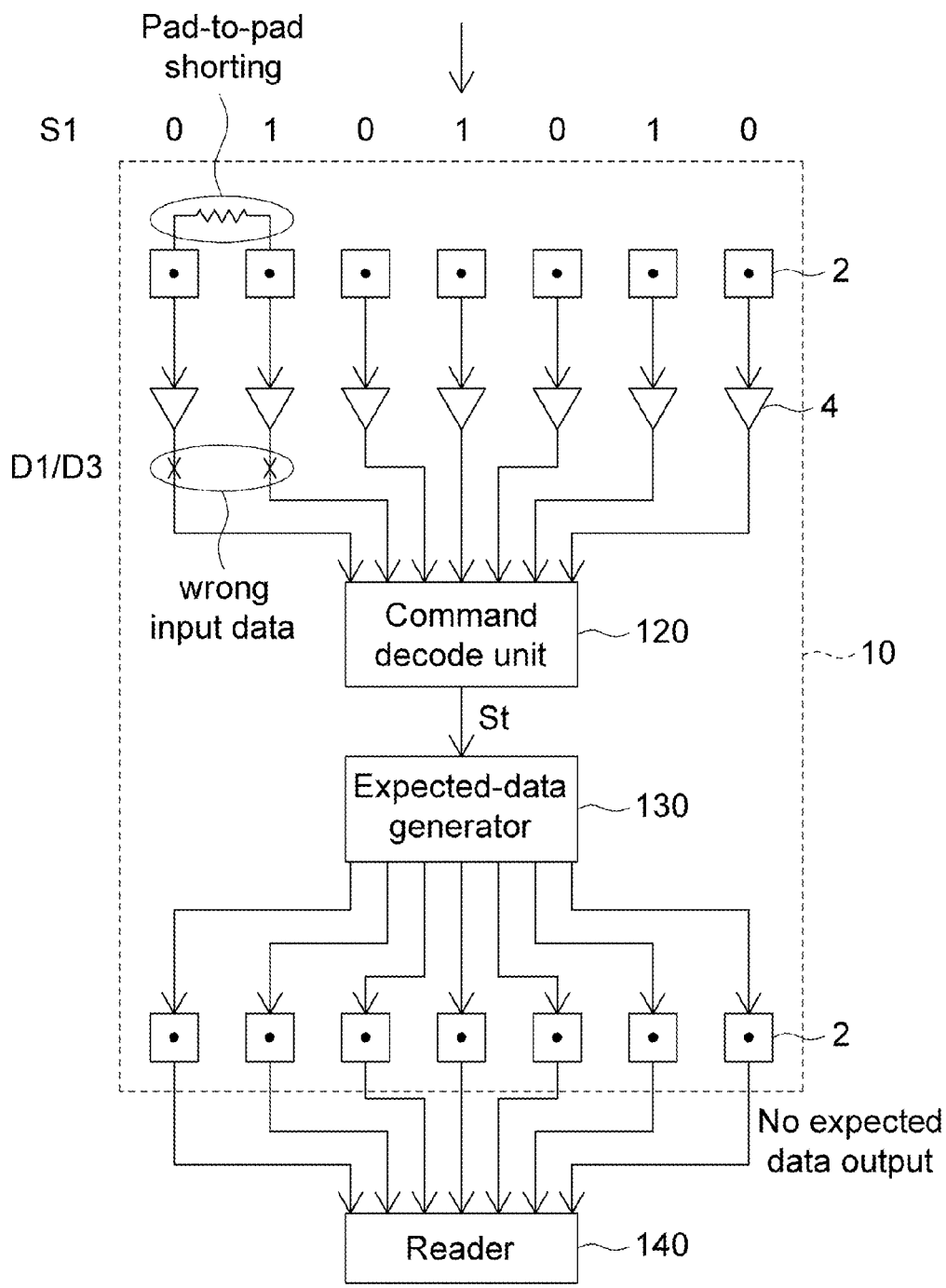
FIG. 1C is a block diagram of the test system of FIG. 1A with the memory chip in a pad-to-pad shorting state.

However, when the pad-to-pad shorting occurs, for example, between the left two pads 2 as shown in FIG. 1C, the two pieces of data D1 (or D3) received through these two pads 2 corresponding to the test signals S1 (0 and 1) will differ from the inputted test signals S1 and become wrong input data. That is, the decoded binary code BC1 (or BC3) corresponding to the test signals S1 will be different from the expected test binary code TB1 (or TB3).

Figure 1D:
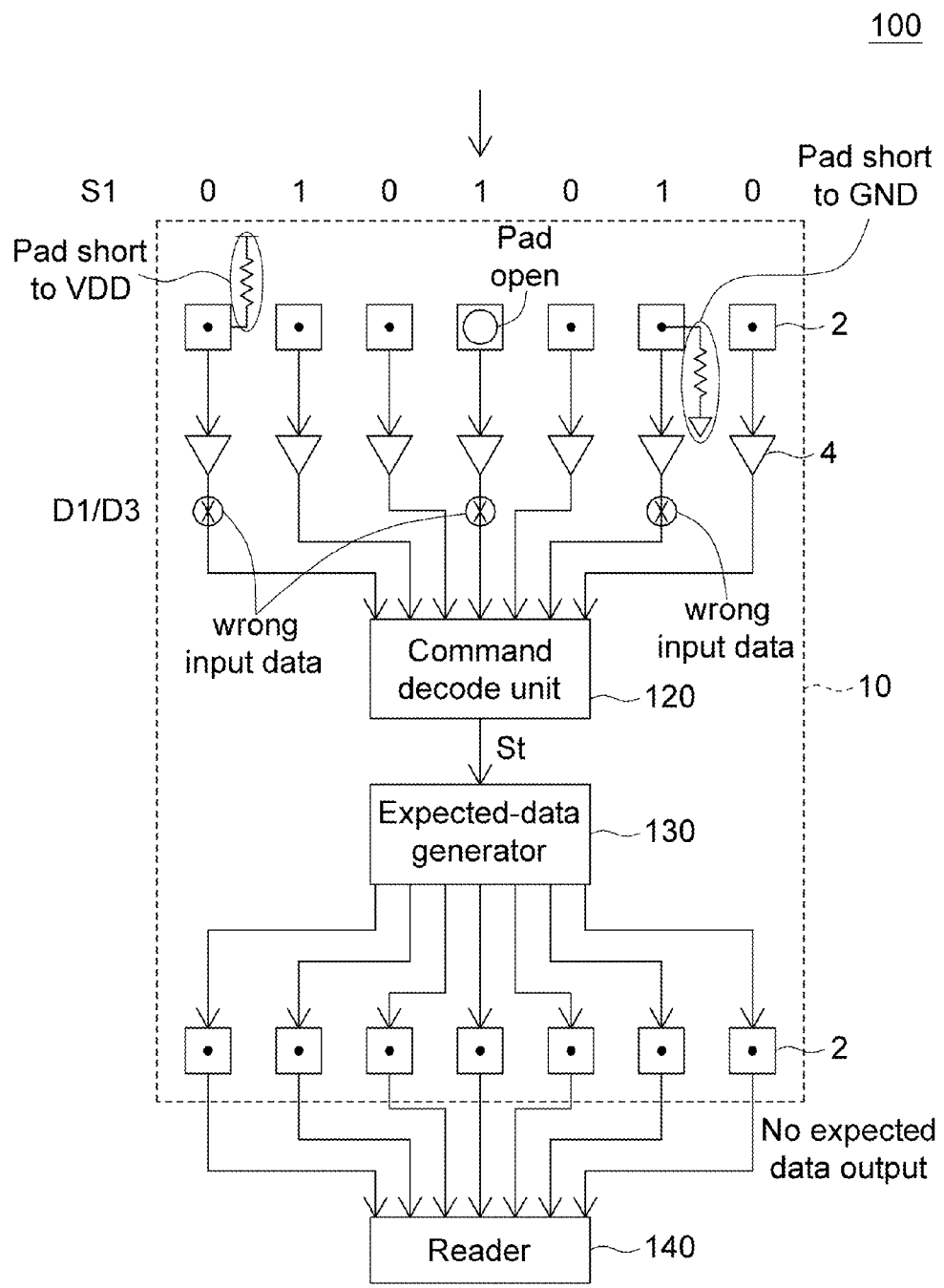
FIG. 1D is a block diagram of the test system of FIG. 1A with the memory chip in a pad-open/short state.

When pad-openness and pad-shortness occur on some of the pads 2, as shown in FIG. 1D, the data D1 (or D3) received through the pad 2 shorted to VDD corresponding to the test signal S1 with the value "0" will become "1", the data D1 (or D3) received through the pad 2 opened corresponding to the test signal S1 with the value "1" will become "0", and the data D1 (or D3) received through the pad 2 shorted to GND corresponding to the test signal S1 with the value "1" will also become "0". Therefore, if any pad-to-pad shorting, pad-openness or pad-shortness occurs on the address pads or I/O pads, the resulting binary codes BC1~BC4 will not all the same as the test binary codes TB1~TB4, respectively.

Besides, the expected-data generator 130 is disposed in the memory chip 100 and coupled to the command decode unit 120 for outputting a piece of expected data De. When the binary codes BC1~BC4 are respectively the same as the test binary codes TB1~TB4, the command decode unit 120 controls the expected-data generator 130 by a trigger signal St to generate the expected data De, such as a binary code, through the I/O pads.

The pads 2 further successively input a first command code C1 and a second command code C2 after inputting the test signals S1~S4. The command decode unit 120 starts to determine whether the first to the fourth binary codes BC1~BC4 are respectively the same as the first to the fourth test binary codes TB1~TB4 according to the first command code C1, and control the expected-data generator 130 to output the expected data De according to the second command code C2 if the first to the fourth binary codes BC1~BC4 are respectively the same as the first to the fourth test binary codes TB1~TB4. If any pad-to-pad shorting, pad openness or shortness occurs, even the first command code C1 received through the address pads will be wrong, and thus no expected data De will be outputted from the expected-data generator 130. On the contrary, if no pad-to-pad short or pad-open/short states exist on the memory chip 10, the command decode unit 120 will receive the correct first and second command codes C1 and C2 and accordingly control the expected-data generator 130 to output the expected data De.

The reader 140 is coupled to the I/O pads 2 of the memory chip 10 for reading data through the I/O pads 2 and determining a test result of the memory chip 10 according to the read data. The reader 140 determines the memory chip 10 is normal if the expected data De is read and test failure if the expected data De is not read.

Figure 1E:
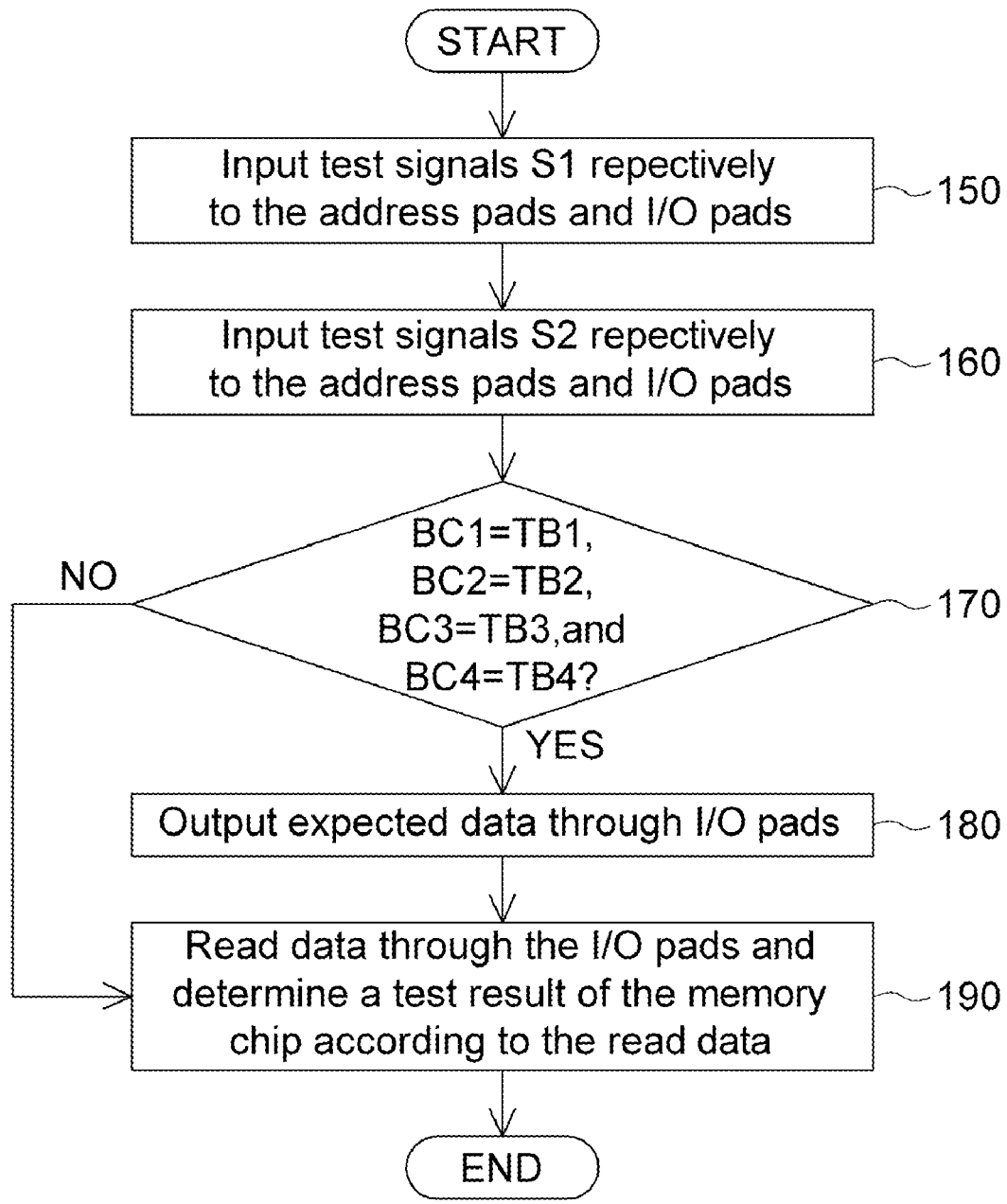
FIG. 1E is a flow chart of a method for testing a chip package according to the first embodiment of the invention.

Referring to FIG. 1E, a flow chart of a method for operating the memory chip 10 according to the first embodiment of the invention is shown. As mentioned above, the memory chip 10 is exemplified to be the parallel flash memory 48TSOP. First, in step 150, input a number of first test signals S1 to the address pads A0~A21 and I/O pads Q0~Q15, respectively, wherein the first test signals S1 corresponding to two physically-adjacent address and I/O pads are complementary (0/1). In the embodiment, two physically-adjacent address (or I/O) pads include the two address (or I/O) pads located next to each other, such as A1 and A2 (or Q0 and Q8), and the two address (or I/O) pads having no other address (or I/O) pads interleaving therebetween, such as A18 and A21 (or Q11 and Q4).

Next, in step 160, input a number of second test signals S2, respectively successive to the first test signals S1, to the address pads A0~A21 and the I/O pads, wherein the first test signal S1 and the second test signal S2 corresponding to each of the address pads A0~A21 and I/O pads Q0~Q15 are complementary. The test signals S1~S2 corresponding to the address pads A0~A21 and I/O pads Q0~Q15 in a physical pattern are as shown in the above description.

In the steps 150 and 160, the first signals S1 are corresponding to the first test binary code TB1: "1555CCh" in the logic sequence of the address pads A0, A1, A2 . . . , A20 and A21, the second signals S2 are corresponding to the second test binary code TB2: "2CCC55h", the third test signals S3 are corresponding to the third test binary code TB3: "00FFh", and the fourth test signals S4 are corresponding to the fourth test binary code TB4: "FF00h" as described above.

As shown in Table 1, the first test binary code "1555CCh" and the third test binary code "00FFh" are provided in a first bus cycle, and the third test binary code "2CCC55h" and the fourth test binary code "FF00h" are provided in the second bus cycle.

TABLE 1

| 1st bus cycle | | 2nd bus cycle | | 3rd bus cycle | | 4th bus cycle | |
|---|---|---|---|---|---|---|---|
| Add | Data | Add | Data | Add | Data | Add | Data |
| 1555CC | 00FF | 2CCC55 | FF00 | 1555CC | 90 | X05 | C2 |

Following that, in step 170, determine whether the first test signal S1 and the second test signal S2 are successfully received by the memory chip 10 through the address pads A0~A21 and I/O pads Q0~Q15. As shown in Table 1, in a third bus cycle, a first command code C1, such as "1555CCh", is provided to the address pads A0~A21 and a piece of command data, such as "90", is provided to a part of the I/O pads Q0~Q15 in a logic sequence. The memory chip 10 reconstructs the data D1 and D3 received through the address pads (A0~A21) and I/O pads (Q0~Q15) corresponding to the first test signals S1 into the first binary code BC1 and the second binary code BC2, and reconstructs the data D2 and D4 received through the address pads and I/O pads corresponding to the second test signals S2 into the third binary code BC3 and the fourth binary code BC4.

Then, according to the first command code C1 and the command data received, the command decode unit 120 determines whether the first binary code BC1 and the second binary code BC2 are respectively the same as the first test binary code TB1: "1555CCh" and the second test binary code TB2: "2CCC55h" and whether the third binary code BC3 and the fourth binary code BC4 are respectively the same as the third test binary code TB3: "00FFh" and the fourth test binary code TB4: "FF00h".

Afterwards, in step 180, if the first test signals S1 and the second test signals S2 are successfully received by the memory chip 10 through the address pads A0~A21 and the I/O pads Q0~Q15, output a piece of expected data De from the memory chip 10. That is, if the binary codes BC1 and BC2 decoded from the received data D1 and D2 are respectively the same as the test binary codes TB1: "1555CCh" and TB2: "2CCC55h" and the binary codes BC3 and BC4 decoded from the received data D3 and D4 are respectively the same as the test binary code TB3: "00FFh" and TB4: "FF00h", as shown in Table 1, in a fourth bus cycle, output the expected data De, such as "C2h", through a part of I/O pads according to a second command code C2, such as "05h" inputted through the address pads.

As mentioned above, if pad-to-pad short or pad open/short states exist on the memory chip 10, the binary codes BC1~BC4 obtained from the data received through the address pads and I/O pads will not all the same as the test binary codes TB1~TB4, respectively in the step 170. In this situation, no expected data De will be outputted from the memory chip 10, and the method proceeds to the step 190. On the contrary, if no pad-to-pad shorting, pad openness, or pad-shortness occurs on the memory chip 10, the binary codes BC1~BC4 will be respectively the same as the expected test binary codes TB1~TB4 in the step 170 and the expected data De is outputted through the I/O pads of the memory chip 10 in the step 180.

Finally, in step 190, read data through the I/O pads of the memory chip 10 (by the reader 140), and determines a test result of the memory chip 10 according to the read data. The memory chip 10 is determined to be normal if the expected data De is read and test failure if the expected data De is not read.

By the above design, openness or shortness of the address pads and I/O pads (2) of the memory chip 10 can be easily tested by determining whether the expected data is read or not, thereby greatly simplifying the test process.

Although both the address pads and I/O pads are exemplified to be inputted by the test signals S1 and S2 in the embodiment of the invention, the test system and method can also successively input the test signals S1 and S2 to the address pads only. As long as the test signals S1 and S2 are complementary corresponding to each address pad and the test signals S1 (or S2) corresponding to any two-physically adjacent address pads are also complementary, and the pad-to-pad short, open/short states can be tested by reading the data outputted from the memory chip, the purpose of simplifying the test process can be achieved and thus all the alternatives will not depart from the scope of the invention.

Embodiment Two

Figure 2A:
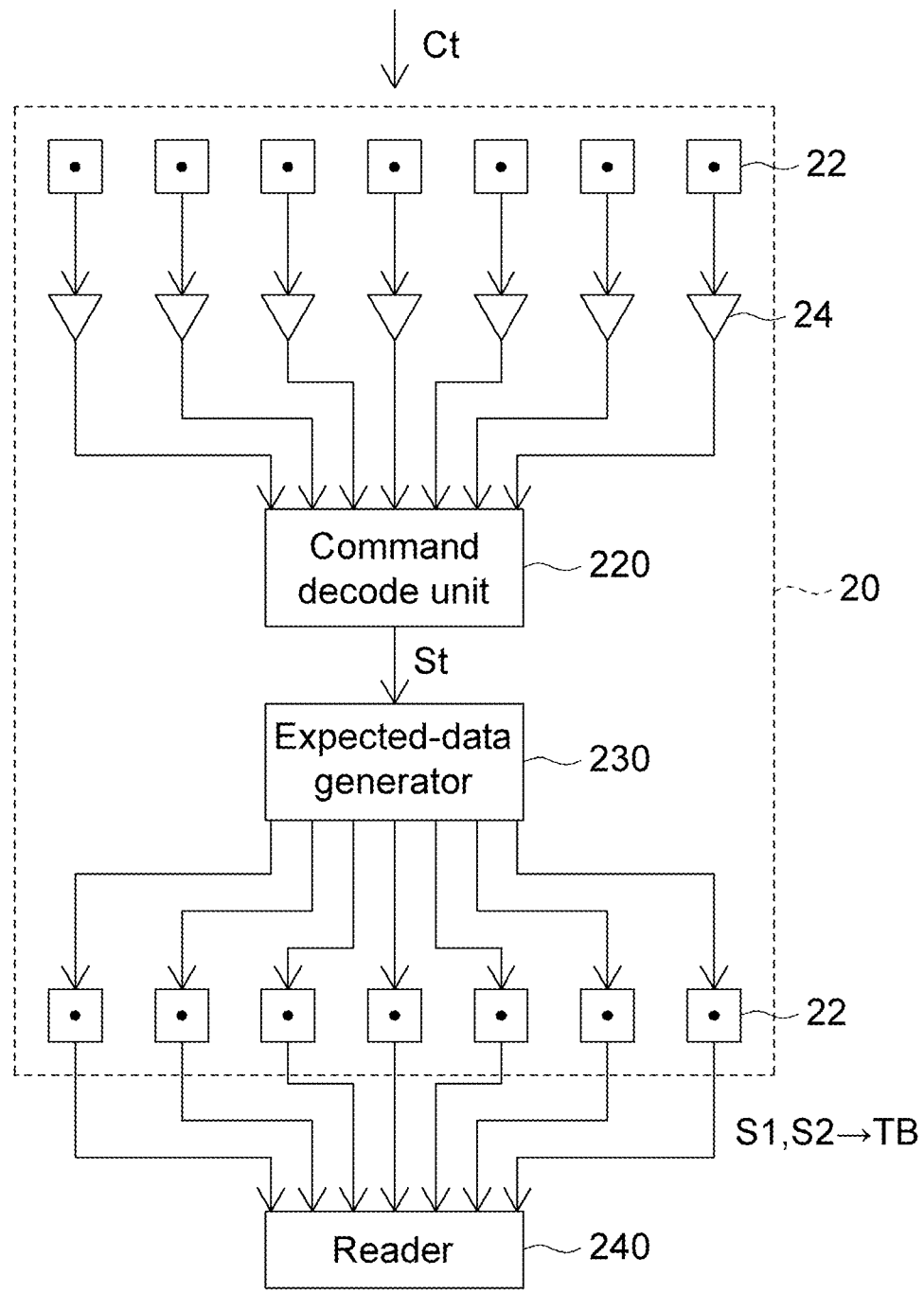
FIG. 2A is a block diagram of a system for testing a chip package according to a second embodiment of the invention.

Referring to FIG. 2A, a block diagram of a memory chip according to a second embodiment of the invention is shown. The memory chip 20, such as a KGD memory applied in a MCP, includes a number of pads 22. These pads 22 include power pads, control pads, and I/O pads. The memory chip 20 further includes a command decode unit 220, an expected-data generator 230, and a reader 240. The pads 22 are for inputting a test command Ct to the memory chip 20. The test command Ct is for commanding the memory chip 20 to enter an I/O read mode. The test command Ct is first stored in an input buffer 24 of the memory chip 20 and then passed to the command decode unit 220.

The command decode unit 220 is disposed in the memory chip 20 for receiving the test command Ct and accordingly outputting a trigger signal St. The expected-data generator 230 is disposed in the memory chip 20 and coupled to the command decode unit 220 for correspondingly outputting a number of first test signals S1 and a number of second test signals S2, respectively successive to the first test signals S1, from all the I/O pads (22) according to the trigger signal St, wherein the first test signals S1 corresponding to two physically-adjacent I/O pads are complementary, and the first test signal S1 and the second test signal S2 corresponding to each of the I/O pads are complementary.

Figure 2B:
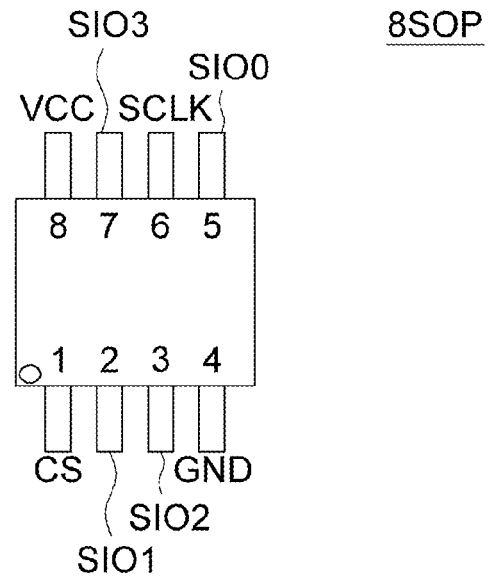
FIG. 2B is a schematic diagram of pad order arrangement of a serial flash memory 8SOP.

For example, the memory chip 20 is a serial flash memory 8SOP, which includes 2 power pads VCC and GND, a control pad CS, a clock pad SCLK and 4 I/O pads SIO0~SIO3, as shown in FIG. 2B. The 4 I/O pads are respectively SIO0, SIO1, SIO2 and SIO3 in a logic sequence, and SIO0, SIO3 (at the top side), SIO1 and SIO2 (at the bottom side) in a physical pattern.

Figure 2C:
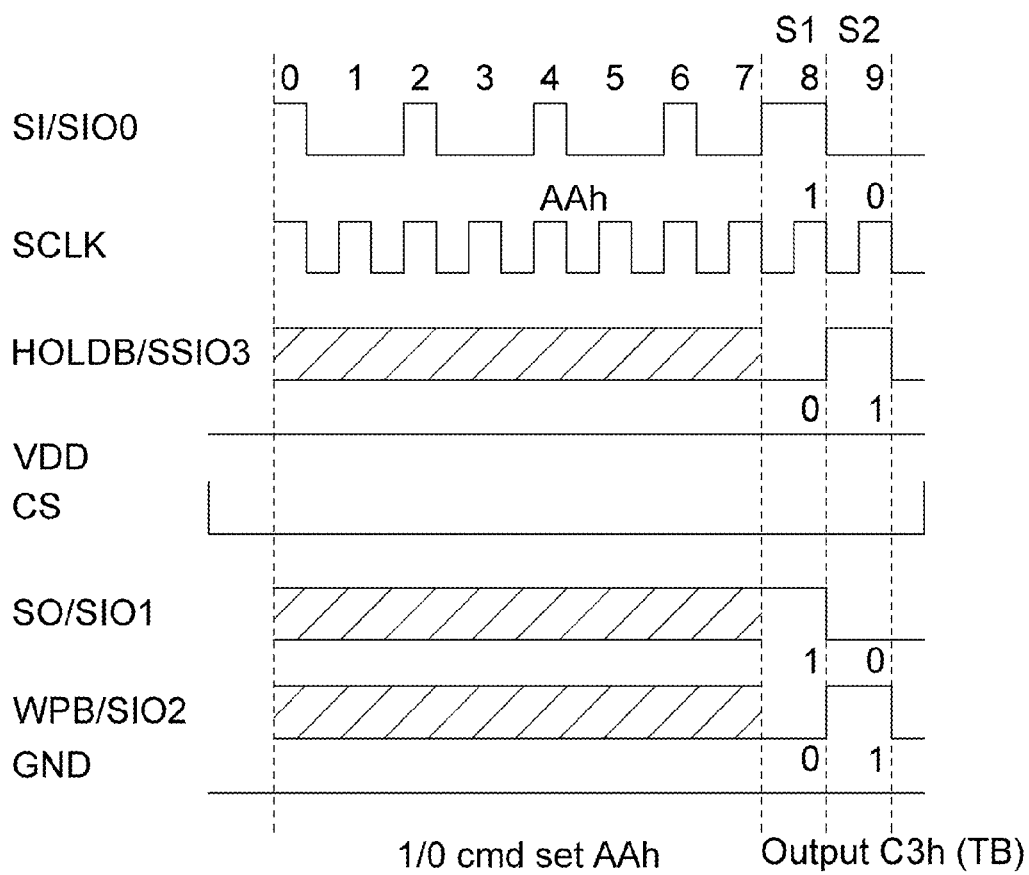
FIG. 2C is a waveform diagram of the test command, clock signal, and the signals on the I/O pads SIO0~SIO3 of FIG. 2B.

The test command Ct drives the memory chip 20 to enter a 4IO read ID mode. The test command Ct is inputted to the command decode unit 220 through one I/O pad, such as SIO0, and the command decode unit 220 receives the test command Ct to be "AAh, 10101010" according to a rising edge of a clock signal inputted through a clock pad SCLK as shown in FIG. 2C. Then, the command decode unit 220 controls the expected-data generator 230 to output two clocks of test signals S1 and S2 in the 4IO read ID mode according to the test command Ct: "AAh" as shown in FIG. 2C.

Although the test command Ct (AAh) is exemplified to be inputted through one I/O pad in the embodiment, the test command Ct of the invention can also be issued by 1 IO input, through SI, dual IO input, through SI/SO, or quad IO input, through SIO[0:3].

The reader 240 can determine open/short states of the I/O pad SIO0 sending the test command Ct and the clock pad SCLK sending the clock signal according to the data read from the I/O pads of the memory chip 20. If two clocks of signals are outputted from the I/O pads SIO0~SIO3, it means the test command Ct is successfully received by the command decode unit 220 and thus there are no pad-to-pad shorting and pad-open/short states on the pads SIO0 and SCLK.

The two clocks of test signals S1 and S2 corresponding to the I/O pads SIO0~SIO3 in a physical pattern and a test binary code TB: "C3h, 11000011" combined from two binary code TB1 (1100) and TB2 (0011) corresponding to the two clocks of test signals S1 and S2 in a logic sequence of the I/O pads SIO0~SIO3 are shown below:

| | SIO0 | SIO3 | SIO1 | SIO2 | | SIO0 | SIO1 | SIO2 | SIO3 |
|---|---|---|---|---|---|---|---|---|---|
| S1: | 1 | 0 | 1 | 0 | TB1: | 1 | 1 | 0 | 0 |
| S2: | 0 | 1 | 0 | 1 | TB2: | 0 | 0 | 1 | 1 |

As mentioned above, when the memory chip 20 is normal, there is no pad-to-pad shorting, or pad-open/short state on the I/O pads SIO0~SIO3, the test binary code TB: "C3h" can be read by the reader 240. However, when the pad-to-pad shorting, pad-openness or pad-shortness occurs, the reader 240 will read a wrong binary code in stead of the expected test binary code TB: "C3h".

The reader 240 is coupled to the I/O pads of the memory chip 20 for reading data through the I/O pads to determine whether the test signals S1 and S2 can be successfully read, i.e. the test binary code TB can be read from the I/O pads. The reader 240 determines the memory chip 20 is normal if the test binary code TB: "C3h" is read and test failure if the data read is not the test binary code TB: "C3h".

Figure 2D:
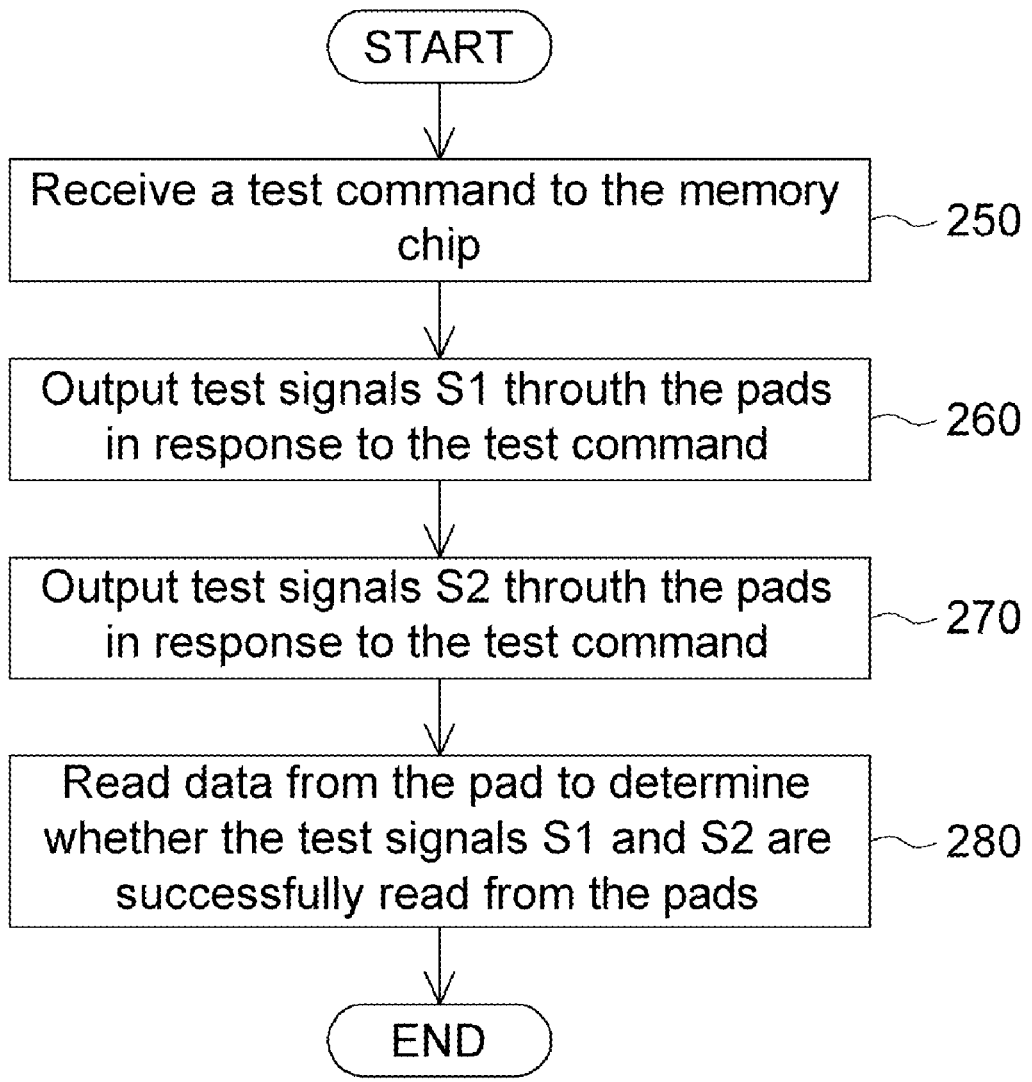
FIG. 2D is a flow chart of a method for testing a chip package according to the second embodiment of the invention.

Referring to FIG. 2D, a flow chart of a method for operating the memory chip 20 according to the second embodiment of the invention is shown. As mentioned above, the memory chip 20 is exemplified to be the serial flash memory 8SOP. First, in step 250, receive a test command Ct to the memory chip 20 (e.g. via the I/O pads SIO0) to enter a 4IO read mode. Next, in step 260, output a number of first test signals S1 through the pads 22, such as I/O pads SIO0~SIO3 in response to the test command Ct, wherein the first test signals S1 corresponding to two physically-adjacent pads 22 are complementary. Then, in step 270, output a number of second test signals S2 successive to the first test signals S1, through the pads (I/O pads SIO0~SIO3) in response to the test command Ct, wherein the first test signal S1 and the second test signal S2 corresponding to each of the pads (SIO0~SIO3) are complementary. The test signals S1 and S2 corresponding the I/O pads SIO0~SIO3 in a physical pattern and the test binary code TB corresponding to the two clocks of test signals S1 and S2 in the logic sequence have been shown in the above description.

For example, the command decode unit 240 decodes the test command Ct to be "AAh" according to the clock signal (SCLK) and accordingly controls the expected-data generator 230 to output the two clocks of test signals S1 and S2 as shown in FIG. 2C.

Finally, in step 280, read data from the I/O pads (e.g. via the reader 240) to determine whether the first test signals S1 and the second test signals S2 are successfully read from the pads 22 (SIO0~SIO3), i.e. whether the binary code TB: "C3h" is read from the I/O pads SIO0~SIO3. If there is no pad-to-pad shorting and pad-openness or pad-shortness on the I/O pads SIO0~SIO3, the test binary code "C3h" will be successfully read by the reader 240 through the I/O pads SIO0~SIO3 and the memory chip 20 is determined to be normal. On the contrary, if there exist pad-to-pad shorting and pad-openness or pad shortness on the I/O pads SIO0~SIO3, a wrong binary code will be read by the reader 240 through the I/O pads SIO0~SIO3 in stead of the test binary code TB: "C3h", and the memory chip 20 is determined to be test failure.

By the above design, openness and shortness of the I/O pads (output pads 22) of the memory chip 20 can be easily tested by determining whether the expected test binary code is read or not, thereby greatly simplifying the test process.

The memory chip and method for operating the same disclosed by the above two embodiments of the invention can easily test if the input pads (address pads and I/O pads) or output pads (I/O pads) of the memory chip are normal by inputting two complementary test signals through the input pads or outputting two complementary test signals through the output pads and determining whether the expected data (or binary code) is read. Therefore, the test process of the memory chip can be greatly simplified.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for operating a memory chip, the memory chip comprising a plurality of pads, the method comprising:
providing the plurality of pads with a plurality of first signals which are complementary at two physically-adjacent pads; and
providing each of the plurality of pads with a second signal which is complementary to the first signal at each of the plurality of pads.

2. The method according to claim 1, wherein the method further comprises a step of receiving a test command, the step of providing the plurality of pads with a plurality of first signals comprises outputting the plurality of first signals through the pads in response to the test command; and the step of providing each of the plurality of pads with a second signal comprises outputting the plurality of second signals successive to the first signals through the pads in response to the test command.

3. The method according to claim 2, wherein the test command is inputted to the memory chip through one I/O pad, and the memory chip decodes the test command according to a clock signal.

4. The method according to claim 2, wherein whether the pads are in open or short states is checked according to data read through the pads.

5. The method according to claim 2, further comprising determining whether the first signals and the second signals are successfully read from the pads.

6. The method according to claim 5, wherein the step of determining whether the first signals and the second signals are successfully read from the pads further comprises determining whether a test binary code combined from the first signals and the second signals in a logic sequence of the pads is read through the pads.

7. The method according to claim 2, wherein the pads are I/O pads of the memory chip.

8. A memory chip, comprising:
a plurality of pads; and
a unit for providing the plurality of pads with a plurality of first signals and a plurality of second signals, wherein the first signals corresponding to two physically-adjacent pads are complementary, and the first signal and the second signal corresponding to each of the pads are complementary.

9. The memory chip according to claim 8, wherein the unit comprises:
a command decoder for receiving a test command; and
an expected-data generator for respectively outputting the plurality of first signals and the plurality of second signals through the pads in response to the test command.

10. The memory chip according to claim 9, wherein the command decoder decodes the test command and accordingly outputs a control signal, and the expected-data generator outputs the first signals and the second signals according to the control signal.

11. The memory chip according to claim 9, wherein the test command is inputted to the command decoder through one I/O pad, and the command decoder decodes the test command according to a clock signal.

\* \* \* \* \*